(12) United States Patent
Gajdeczko et al.

(10) Patent No.: US 7,124,624 B2
(45) Date of Patent: Oct. 24, 2006

(54) HIGH-RESOLUTION GAS GAUGE PROXIMITY SENSOR

(75) Inventors: Boguslaw F. Gajdeczko, Princeton, NJ (US); Kenneth M. Bogursky, Oxford, CT (US); Daniel N. Galburt, Wilton, CT (US); Willy M. Sander, Stamford, CT (US); Kevin J. Violette, Woodbury, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/198,278

(22) Filed: Aug. 8, 2005

(65) Prior Publication Data

US 2005/0268698 A1 Dec. 8, 2005

Related U.S. Application Data

(63) Continuation of application No. 10/322,768, filed on Dec. 19, 2002, now Pat. No. 7,010,958.

(51) Int. Cl.
*G01B 13/08* (2006.01)
*G01B 13/12* (2006.01)

(52) U.S. Cl. .......................... 73/37.5; 73/105
(58) Field of Classification Search .............. 73/37.5, 73/105
See application file for complete search history.

(56) References Cited

U.S. PATENT DOCUMENTS

| | | | | |
|---|---|---|---|---|
| 2,571,557 A | 10/1951 | Fortier | ................... | 73/37.5 |
| 2,986,924 A | 6/1961 | Becker | ................... | 73/37.5 |
| 3,026,714 A | 3/1962 | Evans et al. | ................ | 73/37.7 |
| 3,433,408 A | 3/1969 | Bellman et al. | ............ | 235/201 |
| 3,482,433 A | 12/1969 | Gladwyn | ................... | 73/37.5 |
| 3,792,609 A | 2/1974 | Blair et al. | ............... | 73/861.52 |
| 4,041,584 A | 8/1977 | Williamson | ................... | 28/269 |
| 4,179,919 A | 12/1979 | McKechnie | ................ | 73/37.5 |
| 4,187,715 A | 2/1980 | Nevitt | ....................... | 73/37.9 |
| 4,550,592 A | 11/1985 | Dechape | ................... | 73/37.5 |
| 4,583,917 A | 4/1986 | Shah | ........................ | 417/63 |
| 4,953,388 A | 9/1990 | Barada | .................... | 73/37.5 |
| 4,971,517 A | 11/1990 | Perkey et al. | ................ | 415/14 |
| 5,181,532 A | 1/1993 | Brodfors et al. | | |
| 5,184,503 A | 2/1993 | Hancock | ................... | 73/37.5 |
| 5,317,898 A | 6/1994 | Nemeth | .................... | 73/37.7 |
| 5,540,082 A | 7/1996 | Okuyama et al. | ........... | 73/37.5 |
| 6,152,162 A | 11/2000 | Balazy et al. | .............. | 137/110 |
| 6,244,121 B1 | 6/2001 | Hunter | .................... | 73/865.9 |

FOREIGN PATENT DOCUMENTS

GB    1 399 397    7/1975

(Continued)

OTHER PUBLICATIONS

Burrows, V.R., "The Principles and Applications of Pneumatic Gauging," FWP Journal, Oct. 1976, pp. 31-42.

(Continued)

*Primary Examiner*—Daniel S. Larkin
(74) *Attorney, Agent, or Firm*—Sterne, Kessler, Goldstein & Fox PLLC

(57) ABSTRACT

An apparatus and method for precisely detecting very small distances between a measurement probe and a surface, and more particularly to a proximity sensor using a constant gas flow and sensing a mass flow rate within a pneumatic bridge to detect very small distances. Within the apparatus the use of a flow restrictor and/or snubber made of porous material and/or a mass flow rate controller enables detection of very small distances in the nanometer to sub-nanometer range. A further embodiment wherein a measurement channel of a proximity sensor is connected to multiple measurement branches.

19 Claims, 13 Drawing Sheets

FOREIGN PATENT DOCUMENTS

JP          57-191507          11/1982          ................. 73/37.5

OTHER PUBLICATIONS

Austrian Search Report, dated Nov. 11, 2004, for Singapore Patent Appl. No. 200307488-7, 6 pages.

Derwent Abstract Accession No. 86-324714/49, Class P51, SU 1225634 A (Kiev Autom Inst) Apr. 23, 1986.

Search Report from European Patent Application No. 03028485.5, 7 pages (dated Aug. 3, 2004).

Search Report from European Patent Application No. 03029016.7, 7 pages (dated Aug. 3, 2004).

Search Report from Singapore Patent Application No. SG 200307486-1, 4 pages (dated Jul. 12, 2004).

Sensitivity of the air gauge vs. air flow rate and standoff with 1.14mm nozzle ID and 7 mm long porous restrictor Sensitivity of the air gauge vs. nozzle ID and restrictor length of 200 SCCM air flow rate and 100 μm standoff

HIGH-RESOLUTION GAS GAUGE PROXIMITY SENSOR

CROSS REFERENCE TO RELATED APPLICATIONS

The present application is a continuation of and claims priority under 35 U.S.C. § 120 to U.S. patent application Ser. No. 10/322,768, entitled *High Resolution Gas Gauge Proximity Sensor*, filed on Dec. 19, 2002, now U.S. Pat. No. 7,010,958, which is hereby expressly incorporated by reference herein in its entirety.

BACKGROUND OF THE INVENTION

1. Field of the Invention

The present invention relates to an apparatus and method for detecting very small distances, and more particularly to proximity sensing with gas flow.

2. Related Art

Many automated manufacturing processes require the sensing of the distance between a manufacturing tool and the product or material surface being worked. In some situations, such as semiconductor lithography, the distance must be measured with accuracy approaching a nanometer.

The challenges associated with creating a proximity sensor of such accuracy are significant, particularly in the context of photolithography systems. In the photolithography context, in addition to being non-intrusive and having the ability to precisely detect very small distances, the proximity sensor can not introduce contaminants or come in contact with the work surface, typically a semiconductor wafer. Occurrence of either situation may significantly degrade or ruin the semiconductor quality.

Different types of proximity sensors are available to measure very small distances. Examples of proximity sensors include capacitance and optical gauges. These proximity sensors have serious shortcomings when used in photolithography systems because physical properties of materials deposited on wafers may impact the precision of these devices. For example, capacitance gauges, being dependent on the concentration of electric charges, can yield spurious proximity readings in locations where one type of material (e.g., metal) is concentrated. Another class of problems occurs when exotic wafers made of non-conductive and/or photosensitive materials, such as Gallium Arsenide (GaAs) and Indium Phosphide (InP), are used. In these cases, capacitance and optical gauges may provide spurious results.

U.S. Pat. Nos. 4,953,388 and 4,550,592 disclose an alternative approach to proximity sensing that uses an air gauge sensor. An air gauge sensor is not vulnerable to concentrations of electric charges or electrical, optical and other physical properties of a wafer surface. Current semiconductor manufacturing, however, requires that proximity is gauged with high precision on the order of nanometers. What is needed is a more precise gas gauge proximity sensor than those described in the above U.S. patents.

SUMMARY OF THE INVENTION

The present invention provides a high-resolution gas gauge proximity sensor and method that significantly improves on the precision of previous types of proximity sensors. The gas gauge proximity sensor determines proximity by detecting a difference in measurement and reference standoffs. A standoff is the distance or gap between a nozzle of the proximity sensor and the surface beneath the nozzle.

To determine the standoff difference, a flow of gas with a constant mass flow rate is metered with a mass flow controller and is forced through two channels—a measurement channel and a reference channel. According to the present invention, porous restrictors are used in the reference channel and measurement channel. The porous restrictors introduce no turbulence and reduce pneumatic noise, while performing a resistive function required for proper operation of the sensor. In alternate embodiments of the present invention, a porous snubber is placed within the proximity sensor following the mass flow controller and before the proximity sensor bifurcates into the reference and measurement channel. The porous snubber quiets gas turbulence and reduces possible acoustic noise propagated through the channels, and enhances the proximity sensor's precision.

Each channel has a probe on the distal end that is positioned above a surface. A gas is forced through the channels and emitted through nozzles against respective measurement and reference surfaces. A bridge channel between the reference and measurement channels senses mass flow between the two channels that is induced by differences in the gas pressure in the reference and measurement channel. The sensed mass flow rate is representative of the difference in reference and measurement standoffs. In other words, the sensed mass flow across the bridge is representative of any difference between a reference standoff of a reference probe and reference surface in the reference channel and a measurement standoff of a measurement probe and a measurement surface in the measurement channel. The gas gauge proximity sensor can provide an indication and invoke a control action based on the sensed mass flow rate.

According to a further aspect of the present invention, different nozzle types can be used as measurement and reference probes. These nozzles enable the sensor to be readily adapted for different types of work surfaces.

According to a further aspect of the present invention, a gas gauge proximity sensor can contain a measurement channel connected to a switching device that connects to multiple measurement branches. Each of the measurement branches has characteristics that are the same as those of a measurement channel in a device that does not contain measurement branches. Multiple measurement branches enhance the ability of a proximity sensor to measure standoffs over a larger region of a measurement surface.

According to a further embodiment of the present invention, a method is provided for a gas gauge proximity sensor with a single measurement channel. The method includes steps of distributing gas flow into measurement and reference channels, and restricting gas flow evenly across cross-sectional areas of each channel.

According to a further embodiment of the present invention, a method is provided for a gas gauge proximity sensor with multiple measurement branches. The method includes steps of distributing gas flow into a measurement branch and a reference channel, restricting gas flow evenly across cross-sectional areas of the reference channel or a measurement branch, and switching between measurement branches. An additional method describes the use of a gas gauge proximity sensor with multiple measurement branches to map the topography of a measurement surface.

Through the use of porous restrictors, a mass flow controller, and/or snubbers, embodiments of the present invention allow measurement of distances based on gas flow at a high-resolution with nanometer accuracy. The present invention is especially advantageous in photolithography systems and tools. In photolithography systems it is increasingly desired to determine a distance between a suitable geometrical reference of a lithography production tool and semiconductor wafers at high-resolution. Using a high-resolution gas flow proximity sensing technique further provides independence of wafer proximity measurements from the physical parameters of wafer materials and materials deposited on wafers during semiconductor fabrication at high-resolution performance.

Further embodiments, features, and advantages of the present invention, as well as the structure and operation of the various embodiments of the present invention are described in detail below with reference to accompanying drawings.

BRIEF DESCRIPTION OF THE FIGURES

The present invention is described with reference to the accompanying drawings. In the drawings, like reference numbers indicate identical or functionally similar elements.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

TABLE OF CONTENTS

A. Gas Gauge Proximity Sensor
1. Flow Restrictors
2. Snubber
3. Nozzles

B. Methods

Figure 1A:
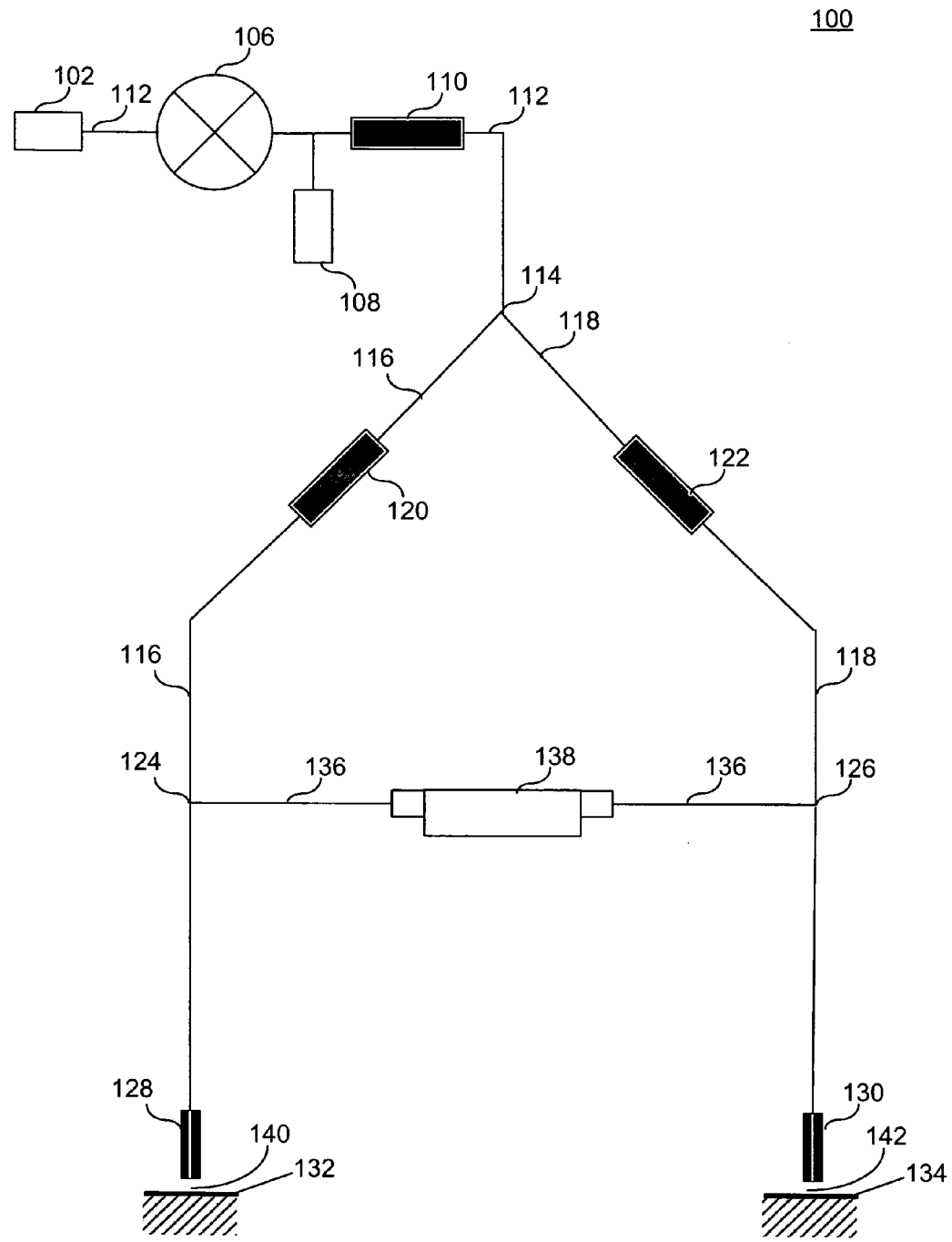
FIG. 1A is a diagram of a gas gauge proximity sensor, according to an embodiment of the present invention.

C. Model and Simulation Results
1. Selection of Simulation Parameters
2. Results D. Conclusion A. Gas Gauge Proximity Sensor FIG. 1A illustrates gas gauge proximity sensor 100, according to an embodiment of the present invention. Gas gauge proximity sensor 100 includes mass flow controller 106, central channel 112, measurement channel 116, reference channel 118, measurement channel restrictor 120, reference channel restrictor 122, measurement probe 128, reference probe 130, bridge channel 136 and mass flow sensor 138. Gas supply 102 injects gas at a desired pressure into gas gauge proximity sensor 100.

Central channel 112 connects gas supply 102 to mass flow controller 106 and then terminates at junction 114. Mass flow controller 106 maintains a constant flow rate within gas gauge proximity sensor 100. Gas is forced out from mass flow controller 106 through a porous snubber 110, with an accumulator 108 affixed to channel 112. Snubber 110 reduces gas turbulence introduced by the gas supply 102, and its use is optional. Upon exiting snubber 110, gas travels through central channel 112 to junction 114. Central channel 112 terminates at junction 114 and divides into measurement channel 116 and reference channel 118. Mass flow controller 106 injects gas at a sufficiently low rate to provide laminar and incompressible fluid flow throughout the system to minimize the production of undesired pneumatic noise.

Bridge channel 136 is coupled between measurement channel 116 and reference channel 118. Bridge channel 136 connects to measurement channel 116 at junction 124. Bridge channel 136 connects to reference channel 118 at junction 126. In one example, the distance between junction 114 and junction 124 and the distance between junction 114 and junction 126 are equal.

All channels within gas gauge proximity sensor 100 permit gas to flow through them. Channels 112, 116, 118, and 136 can be made up of conduits (tubes, pipes, etc.) or any other type of structure that can contain and guide gas flow through sensor 100. The channels do not have sharp bends, irregularities or unnecessary obstructions that may introduce pneumatic noise, for example, by producing local turbulence or flow instability. The overall lengths of measurement channel 116 and reference channel 118 can be equal or in other examples can be unequal.

Reference channel 118 terminates into reference probe 130. Likewise, measurement channel 116 terminates into measurement probe 128. Reference probe 130 is positioned above reference surface 134. Measurement probe 128 is positioned above measurement surface 132. In the context of photolithography, measurement surface 132 is often a semiconductor wafer or stage supporting a wafer. Reference surface 134 can be a flat metal plate, but is not limited to this example. Gas injected by gas supply 102 is emitted from each of the probes 128, 130 and impinges upon measurement surface 132 and reference surface 134. Nozzles are provided in measurement probe 128 and reference probe 130. Example nozzles are described further below with respect to FIGS. 3A–3E. As stated above, the distance between a nozzle and a corresponding measurement or reference surface is referred to as a standoff.

In one embodiment, reference probe 130 is positioned above a fixed reference surface 134 with a known reference standoff 142. Measurement probe 128 is positioned above measurement surface 132 with an unknown measurement standoff 140. The known reference standoff 142 is set to a desired constant value representing an optimum standoff. With such an arrangement, the backpressure upstream of the measurement probe 128 is a function of the unknown measurement standoff 140; and the backpressure upstream of the reference probe 130 is a function of the known reference standoff 142. If standoffs 140 and 142 are equal, the configuration is symmetrical and the bridge is balanced. Consequently, there is no gas flow through bridging channel 136. On the other hand, when the measurement standoff 140 and reference standoff 142 are different, the resulting pressure difference between the measurement channel 116 and the reference channel 118 induces a flow of gas through mass flow sensor 138.

Mass flow sensor 138 is located along bridge channel 136, preferably at a central point. Mass flow sensor 136 senses gas flows induced by pressure differences between measurement channel 116 and reference channel 118. These pressure differences occur as a result of changes in the vertical positioning of measurement surface 132. For a symmetric bridge, when measurement standoff 140 and reference standoff 142 are equal, the standoff is the same for both of the probes 128, 130 compared to surfaces 132, 134. Mass flow sensor 138 will detect no mass flow, since there will be no pressure difference between the measurement and reference channels. Differences between measurement standoff 140 and reference standoff 142 will lead to different pressures in measurement channel 116 and reference channel 118. Proper offsets can be introduced for an asymmetric arrangement.

Mass flow sensor 138 senses gas flow induced by a pressure difference or imbalance. A pressure difference causes a gas flow, the rate of which is a unique function of the measurement standoff 140. In other words, assuming a constant flow rate into gas gauge 100, the difference between gas pressures in the measurement channel 116 and the reference channel 118 is a function of the difference between the magnitudes of standoffs 140 and 142. If reference standoff 142 is set to a known standoff, the difference between gas pressures in the measurement channel 116 and the reference channel 118 is a function of the size of measurement standoff 140 (that is, the unknown standoff in the z direction between measurement surface 132 and measurement probe 128).

Mass flow sensor 138 detects gas flow in either direction through bridge channel 136. Because of the bridge configuration, gas flow occurs through bridge channel 136 only when pressure differences between channels 116, 118 occur. When a pressure imbalance exists, mass flow sensor 138 detects a resulting gas flow, and can initiate an appropriate control function. Mass flow sensor 138 can provide an indication of a sensed flow through a visual display or audio indication. Alternatively, in place of a mass flow sensor, a differential pressure sensor may be used. The differential pressure sensor measures the difference in pressure between the two channels, which is a function of the difference between the measurement and reference standoffs.

The control function may be to calculate the exact gap differences. In another embodiment, the control function may be to increase or decrease the size of measurement gap 140. This is accomplished by moving the measurement surface 132 relative to measurement probe 128 until the pressure difference is sufficiently close to zero, which occurs when there is no longer a difference between the standoffs from measurement surface 132 and reference surface 134.

FIG. 1A illustrates at least three elements of the present invention that reduce gas turbulence and other pneumatic noise to enable the present invention to achieve nanometer accuracy. These elements, mass flow rate controller 106, snubber 110 and restrictors 120, 122, may all be used within an embodiment of the present invention or in any combination depending on the sensitivity desired. For example, if an application required very precise sensitivity, all elements may be used. Alternatively, if an application required less sensitivity, perhaps only snubber 110 would be needed with porous restrictors 120 and 122 replaced by orifices. As a result, the present invention provides a flexible approach to cost effectively meet a particular application's requirements.

According to further embodiments of the present invention, the addition of mass flow rate controller 106 and/or snubber 110 may be used within the systems disclosed in U.S. Pat. Nos. 4,953,388 and 4,550,592 to significantly enhance their sensitivity.

Figure 1B:
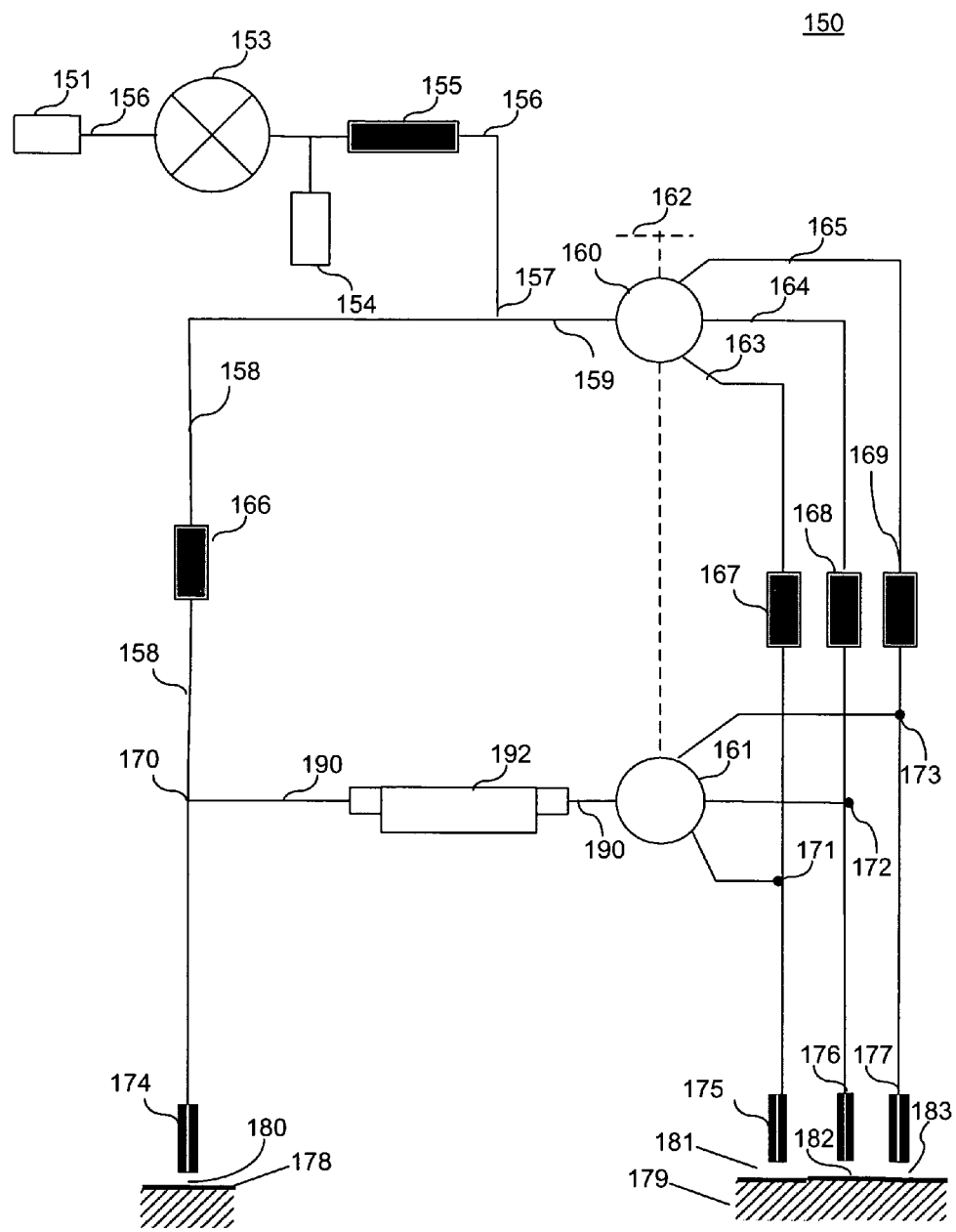
FIG. 1B is a diagram of a gas gauge proximity sensor with multiple measurement branches, according to an embodiment of the present invention.

FIG. 1B illustrates gas gauge proximity sensor 150, according to an embodiment of the present invention. Gas gauge proximity sensor 150 includes many of the same components as gas gauge proximity sensor 100 with similar principles of operation. The difference between the two sensors is that gas gauge proximity sensor 150 has three measurement branches which are comparable to the one measurement channel included within gas gauge proximity sensor 100. Three measurement branches are shown for ease of illustration, and the present invention is not limited to three measurement branches. Any number of measurement branches from two or more may be used.

Gas gauge proximity sensor 150 includes mass flow controller 153, central channel 156, reference channel 158, reference channel restrictor 166, reference probe 174, bridge channel 190 and mass flow sensor 192. In addition, gas gauge proximity sensor 150 includes measurement channel 159. Measurement channel 159 divides into three measurement branches 163, 164 and 165. Measurement branch 163 includes measurement branch restrictor 167 and measurement probe 175. Measurement branch 164 includes measurement branch restrictor 168 and measurement probe 176. Measurement branch 165 includes measurement branch restrictor 169 and measurement probe 177. Finally, gas gauge proximity sensor 150 includes measurement channel switching device 160, bridge channel switching device 161, and switching device lever 162.

Gas supply 151 injects gas at a desired pressure into gas gauge proximity sensor 150. Central channel 156 connects gas supply 151 to mass flow controller 153 and then terminates at a junction 157. Mass flow controller 153 maintains a constant flow rate within gas gauge proximity sensor 150. Mass flow controller 153 injects gas at a sufficiently low rate to provide laminar and incompressible fluid flow throughout the system to minimize the production of undesired pneumatic noise. Gas is forced out from mass flow controller 153 through porous snubber 155, with accumulator 154 affixed to channel 156. Snubber 155 reduces gas turbulence introduced by the gas supply 151, and its use is optional. Upon exiting snubber 155, gas travels through central channel 156 to junction 157. Central channel 156 terminates at junction 157 and divides into measurement channel 159 and reference channel 158. Measurement channel 159 terminates into measurement channel switching device 160. Measurement channel switching device 160 can be a scanning valve or other type of switching device that serves to switch a measurement channel to one of several measurement branches that are also connected to measurement channel switching device 160. The physical characteristics of a measurement branch are the same as the physical characteristics of a measurement channel. Measurement channel switching device 160 is operated by switching device lever 162. Switching device lever 162 controls which measurement branch 163, 164 or 165 is connected to the measurement channel 159 through measurement channel switching device 160.

Bridge channel 190 is coupled between reference channel 158 and one of the three measurement branches 163, 164 or 165 through bridge channel switching device 161. Bridge channel 190 connects to reference channel 158 at junction 170. Bridge channel 190 terminates in bridge channel switching device 161. Bridge channel switching device 161 can be a scanning valve or other type of switching device that serves to switch a bridge channel to one of the measurement branches. In one example shown in FIG. 1B, three measurement branches 163, 164 and 165 are connected to bridge channel switching device 161 at junctions 171, 172, and 173 respectively. Switching device lever 162 controls which measurement branch 163, 164, or 165 is connected to the bridge channel through bridge channel switching device 161. Switching lever 162 controls both measurement channel switching device 160 and bridge channel switching device 161, such that the same measurement branch will be connected to both measurement channel 159 and bridge channel 190. Alternatively, two independent switching levers can be used.

In one example, the distance between junction 157 and junction 170 and the distance between junction 157 and junction 171, 172 or 173 are equal.

All channels and branches within gas gauge proximity sensor 150 permit gas to flow through them. Channels 156, 158, 159, and 190, and branches 163, 164, and 165 can be made up of conduits (tubes, pipes, etc.) or any other type of structure that can contain and guide gas flow through sensor 150. The channels and branches do not have sharp bends, irregularities or unnecessary obstructions that may introduce pneumatic noise, for example, by producing local turbulence or flow instability. The overall lengths of reference channel 158 and measurement channel 159 plus one of measurement branches 163, 164 or 165 can be equal or in other examples can be unequal.

Reference channel 158 terminates into reference probe 174. Likewise, measurement branches 163, 164 and 165 terminate into measurement probes 175, 176 and 177 respectively. Reference probe 174 is positioned above reference surface 178. Measurement probes 175, 176 and 177 are positioned above measurement surface 179. In the context of photolithography, measurement surface 179 is often a semiconductor wafer or stage supporting a wafer. Reference surface 178 can be a flat metal plate, but is not limited to this example. Gas injected by gas supply 151 is emitted from reference probe 174 and impinges upon reference surface 178. Likewise, gas injected by gas supply 151 is emitted from one of the three measurement probes 175, 176 or 177 and impinges on measurement surface 179. The position of switching device lever 162 determines from which measurement probe gas is emitted. Nozzles are provided in probes 174, 175, 176 and 177. Example nozzles are described further below with respect to FIGS. 3A–3E. As stated above, the distance between a nozzle and a corresponding measurement or reference surface is referred to as a standoff.

In one embodiment, reference probe 174 is positioned above a fixed reference surface 178 with a known reference standoff 180. Measurement probes 175, 176 and 177 are positioned above measurement surface 179 with unknown measurement standoffs 181, 182 and 183. Measurement standoffs 181, 182 and 183 may be equal or they may be unequal where the topography of a measurement surface varies from region to region. The known reference standoff 180 is set to a desired constant value representing an optimum standoff. With such an arrangement, the backpressure upstream from measurement probe 175, 176 or 177 that is in use is a function of the unknown measurement standoff 181, 182 or 183 respectively; and the backpressure upstream of the reference probe 174 is a function of the known reference standoff 180. If reference standoff 180 and the measurement standoff 181, 182 or 183 that is being used are equal, the configuration is symmetrical and the bridge is balanced. Consequently, there is no gas flow through bridge channel 174. On the other hand, when the reference standoff 180 and the measurement standoff 181, 182 or 183 corresponding to the measurement branch in use is different, the resulting pressure difference between the reference channel 158 and the measurement branch 163, 164 or 165 that is being used induces a flow of gas through bridge channel 190.

Mass flow sensor 192 is located along bridge channel 190, preferably at a central point. Mass flow sensor 192 senses gas flows induced by pressure differences between reference channel 158 and the measurement branch 163, 164 or 165 that is being used. These pressure differences occur as a result of changes in the vertical positioning of measurement surface 179. For a symmetric bridge, when reference standoff 180 and a measurement standoff 181, 182 or 183 corresponding to the measurement branch that is being used are equal, mass flow sensor 192 will detect no mass flow, since there will be no pressure difference between the measurement branch in use and the reference channel. Differences between the reference standoff 180 and a measurement standoff 181, 182 or 183 corresponding to the measurement branch in use will lead to different pressures in reference channel 158 and the measurement branch 163, 164 or 165 being used. Proper offsets can be introduced for an asymmetric arrangement.

Mass flow sensor 192 senses gas flow induced by a pressure difference or imbalance. A pressure difference causes a gas flow, the rate of which is a unique function of a measurement standoff 181, 182 or 183. In other words, assuming a constant flow rate into gas gauge 150, the difference between gas pressures in a measurement branch 163, 164 or 165 and reference channel 158 is a function of the difference between reference standoff 180 and a measurement standoff 181, 182 or 183 corresponding to the measurement branch that is being used. If reference standoff 180 is set to a known standoff, the difference between gas pressures in a measurement branch 163, 164 or 165 that is being used and reference channel 158 is a function of the size of a measurement standoff (that is, the unknown standoff in the z direction between measurement surface 179 and a measurement probe 175, 176 or 177 that is being used).

Mass flow sensor 192 detects gas flow in either direction through bridge channel 190. Because of the bridge configuration, gas flow occurs through bridge channel 190 only when pressure differences occur between reference channel 158 and a measurement branch 163, 164 or 165 that is being used. When a pressure imbalance exists, mass flow sensor 192 detects a resulting gas flow, and can initiate an appropriate control function. Mass flow sensor 192 can provide an indication of a sensed flow through a visual display or audio indication. Alternatively, in place of a mass flow sensor, a differential pressure sensor may be used. The differential pressure sensor measures the difference in pressure between the reference channel and a measurement branch, which is a function of the difference between a measurement standoff and the reference standoff.

The control function may be to calculate the exact gap differences. In another embodiment, the control function may be to increase or decrease the size of a measurement standoff 181, 182 or 183. This is accomplished by moving the measurement surface relative to a measurement probe until the pressure difference is sufficiently close to zero, which occurs when there is no longer a difference between the standoffs from a measurement surface and reference surface 178.

FIG. 1B illustrates at least three elements of the present invention that reduce gas turbulence and other pneumatic noise to enable the present invention to achieve nanometer accuracy. These elements, mass flow rate controller 153, snubber 155 and restrictors 166, 167, 168 and 169 may all be used within an embodiment of the present invention or in any combination depending on the sensitivity desired. For example, if an application required very precise sensitivity, all elements may be used. Alternatively, if an application required less sensitivity, perhaps only snubber 155 would be needed with porous restrictors 166, 167, 168, and 169 replaced by orifices. As a result, the present invention provides a flexible approach to cost effectively meet a particular application's requirements.

1. Flow Restrictors

According to one embodiment of the present invention and referring to gas gauge proximity sensor 100, measurement channel 116 and reference channel 118 contain restrictors 120, 122. Each restrictor 120, 122 restricts the flow of gas traveling through the respective measurement channel 116 and reference channel 118. Measurement channel restrictor 120 is located within measurement channel 116 between junction 114 and junction 124. Likewise, reference channel restrictor 122 is located within reference channel 118 between junction 114 and junction 126. In one example, the distance from junction 114 to measurement channel restrictor 120 and the distance from junction 114 to reference channel restrictor 122 are equal. In other examples, the distances are not equal. There is no inherent requirement that the sensor be symmetrical, however, the sensor is easier to use if it is geometrically symmetrical.

Figure 2:
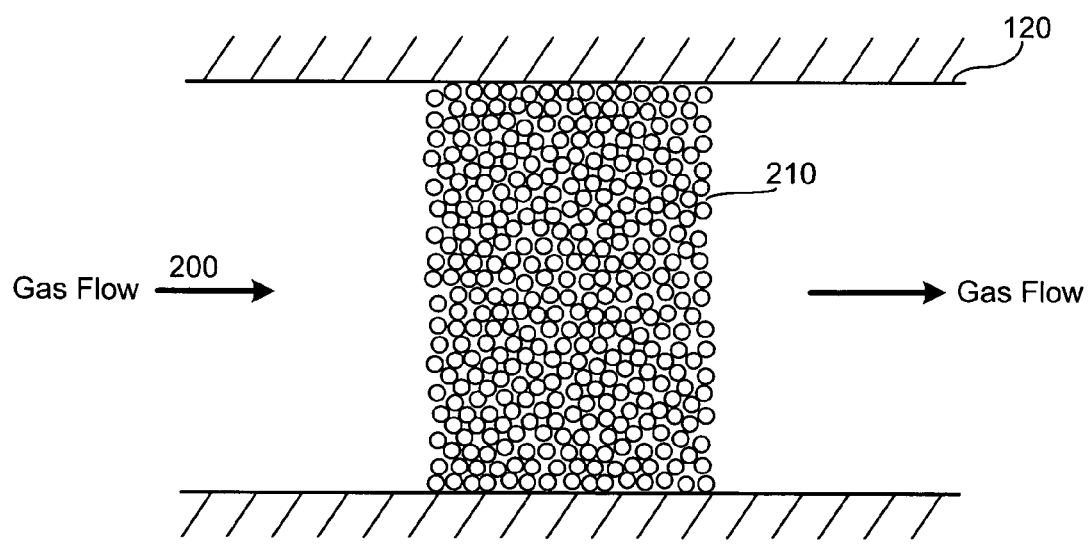
FIG. 2 is a diagram that provides a cross sectional view of a restrictor, according to an embodiment of the present invention.

According to a further feature of the present invention, each restrictor 120, 122 consists of a porous material, such as polyethylene or sintered stainless steel. FIG. 2 provides a cross-sectional image of restrictor 120 having porous material 210 through which a gas flow 200 passes. Measurement channel restrictor 120 and reference channel restrictor 122 have substantially the same dimensions and permeability characteristics. Restrictors typically range in length from 2 to 15 mm, but are not limited to these lengths. Measurement channel restrictor 120 and reference channel restrictor 122 restrict gas flow evenly across the cross-sectional areas of the channels 116, 118. The inventors discovered that porous material restrictors provide a significant reduction in turbulence and associated pneumatic noise in gas flow compared to the amount of turbulence and noise introduced by restrictors that use a single orifice bored out of a solid, non-porous material. Within gas gauge proximity sensor 150, porous restrictors 166, 167, 168 and 169 with above mentioned characteristics are also used to achieve these advantages.

The restrictors serve two key functions. First, they mitigate the pressure and flow disturbances present in gas gauge proximity sensor 100, most notably disturbances generated by mass flow controller 110 or sources of acoustic pick-up. Second, they serve as the required resistive elements within the bridge.

Exemplary embodiments of a gas gauge proximity sensor have been presented. The present invention is not limited to this example. This example is presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

2. Snubber

According to one embodiment of the present invention and referring to gas gauge proximity sensor 100, channel 112 contains snubber 110. Similar to the operation of a restrictor, snubber 110 reduces gas turbulence introduced by gas supply 102 and isolates the mass flow sensor from acoustic pick-up in the upstream part of the gas gauge sensor. Snubber 110 is located within channel 112 between accumulator 108 and junction 114. According to a further feature of the present invention, snubber 110 consists of a porous material, such as polyethylene or sintered stainless steel. The inventors discovered that porous material snubbers provide a significant reduction in turbulence and associated pneumatic noise in gas flow. Snubber 155 used within gas gauge proximity sensor 150 has the same characteristics as snubber 110 and is used to achieve the same benefits.

3. Nozzles

In gas gauge proximity sensor 100, different types of nozzles may be used as reference probe 130 and measurement probe 128 depending on a particular application. Similarly different types of nozzles may be used in gas gauge proximity sensor 150 for reference probe 174 and measurement probes 175, 176 and 177. The choice of nozzle type, among other things, depends on the footprint (measurement area) that is required.

Figure 3A:
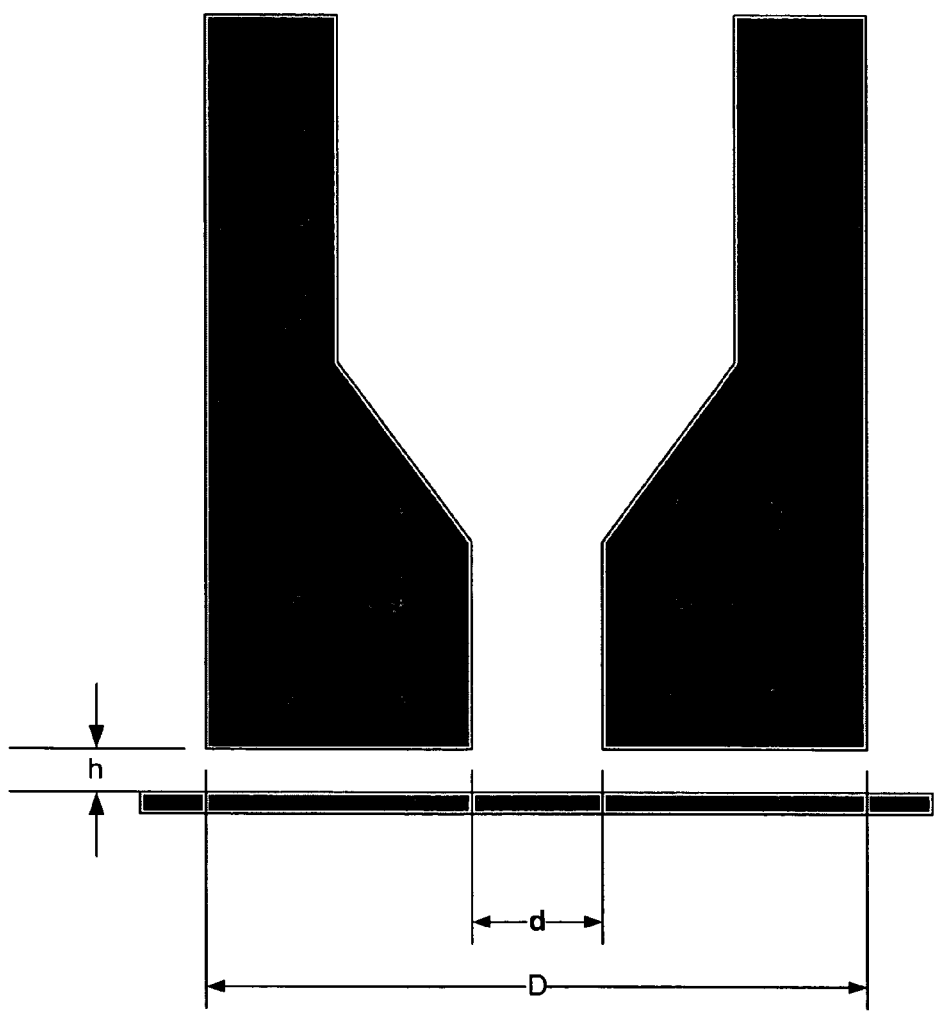
FIG. 3A is a diagram that shows the basic characteristics of a nozzle.

The basic configuration of the gas gauge nozzle 300 is characterized by a flat end surface that is parallel to the surface of the measurement surface, as shown in FIG. 3A. The geometry of a nozzle is determined by the gauge standoff, h, and the inner diameter, d. Generally, the dependence of the nozzle pressure drop on the nozzle outer diameter D is weak, if D is sufficiently large. The remaining physical parameters are: $Q_m$—mass flow rate of the gas, and $\Delta p$—pressure drop across the nozzle. The gas is characterized by the density, $\rho$, and dynamic viscosity, $\eta$.

A relationship is sought between non-dimensional parameters:

$$\frac{\Delta p}{\frac{1}{2}\rho u^2},$$

the Reynolds Number, Re, and $$\frac{h}{d},$$

where the radial velocity, u, is taken at the entrance to the cylindrical region between the nozzle face and the wafer surface. The Reynolds number is defined as $$Re = \frac{ud}{\nu},$$

where $\nu$ is the kinematic coefficient of viscosity.

Figure 5:
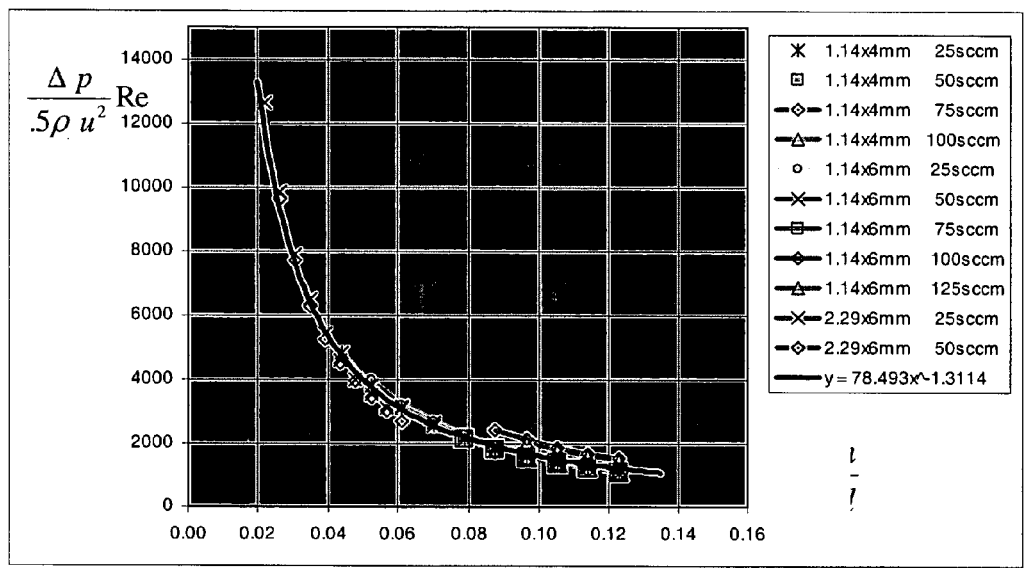
FIG. 5 is a sensitivity plot that illustrates test results for nozzles with different dimensions, according to an embodiment of the present invention.

A series of tests where the measurement standoff was varied were performed using nozzles with different d and using different mass flow rates. FIG. 5 plots the data points for these tests. A suitable fit to data points obtained from the series of measurements that are shown in FIG. 5 yields:

$$\frac{\Delta p}{\frac{\rho u^2}{2}} \frac{ud}{\nu} = 78.493 \left(\frac{h}{d}\right)^{-1.3114} \quad (1)$$

Since the mass flow rate of air through the nozzle can be written as:

$$Q_m = \rho u \pi d h \quad (2)$$

expressing the velocity u in terms of the mass flow rate $Q_m$ and inner nozzle diameter d yields $$\Delta p \cong \frac{78.493}{2\pi} \cdot Q_m \nu h^{-2.3114} d^{-0.6886}. \quad (3)$$

The behavior of the nozzle is then described in terms of five physical variables: $\nu$, $\Delta p$, $Q_m$, d, and h. Eq. (3) provides a relationship between the two principal variables, $\Delta p$ and h, as the remaining variables would be typically constant for a practical system. This relationship facilitates the development of nozzle types for different applications, requiring different sensitivities.

Figure 3B:
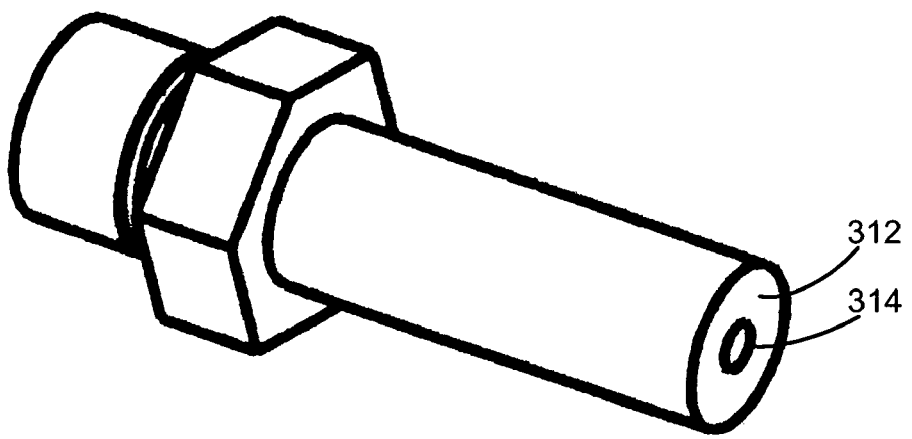
FIG. 3B is a diagram that shows a perspective view of a nozzle that may be used in a reference probe or a measurement probe, according to an embodiment of the present invention.
Figure 3C:
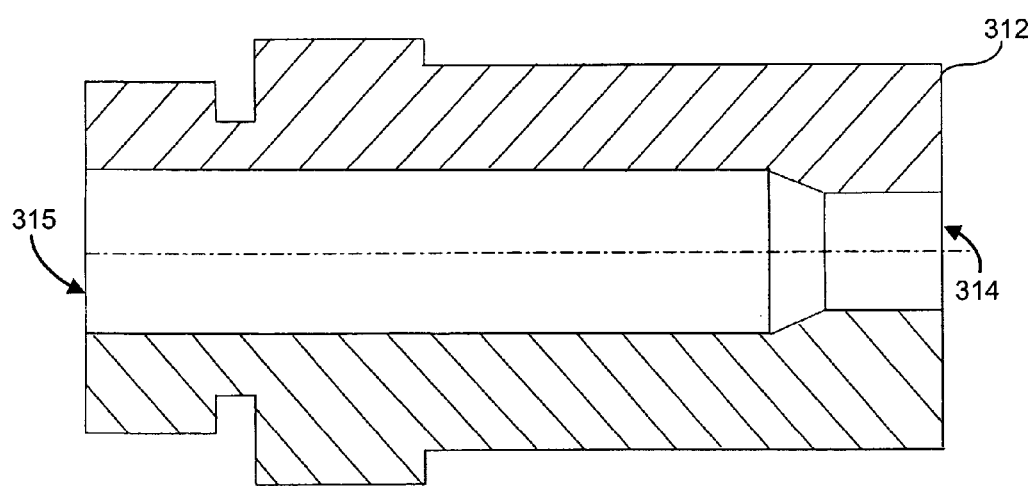
FIG. 3C is a diagram that shows a cross sectional view of the nozzle illustrated in FIG. 3B, according to an embodiment of the present invention.

FIGS. 3B and 3C illustrate a nozzle 310 that may be used as a reference probe or measurement probe, according to an embodiment of the present invention. Nozzle 310 includes front surface 312, gas bore front opening 314, and gas bore rear opening 315.

Nozzle 310 is affixed to both measurement channel 116 and reference channel 118. In one embodiment, two identical nozzles 310 serve as measurement probe 128 and reference probe 130. In principle, the nozzles do not need to be identical. Nozzle 310 is affixed to measurement channel 116. Front surface 312 should be parallel to measurement surface 132. Gas travelling through measurement channel 116 enters nozzle 310 through gas bore rear opening 315 and exits through gas bore front opening 314. Similarly, nozzle 310 is affixed to reference channel 118. Front surface 312 is parallel to reference surface 134. Gas travelling through reference channel 118 enters nozzle 310 through gas bore rear opening 315 and exits through gas bore front opening 314. The diameter of gas bore front opening 314 can vary depending upon a particular application. In one example, the inner diameter of gas bore front opening 314 is between approximately 0.5 and 2.5 millimeters (mm). Example sensitivity analysis results of a gas gauge proximity sensor model having porous flow restrictors and single gas bore nozzles at the probes are described further below with respect to FIGS. 6–8.

Figure 3D:
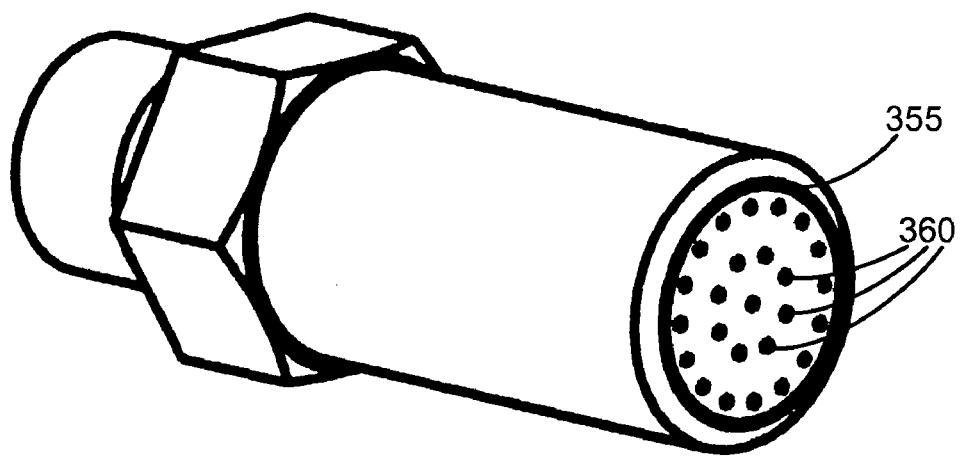
FIG. 3D is a diagram that shows a perspective view of a shower-head nozzle that may be used in a reference probe or a measurement probe, according to an embodiment of the present invention.
Figure 3E:
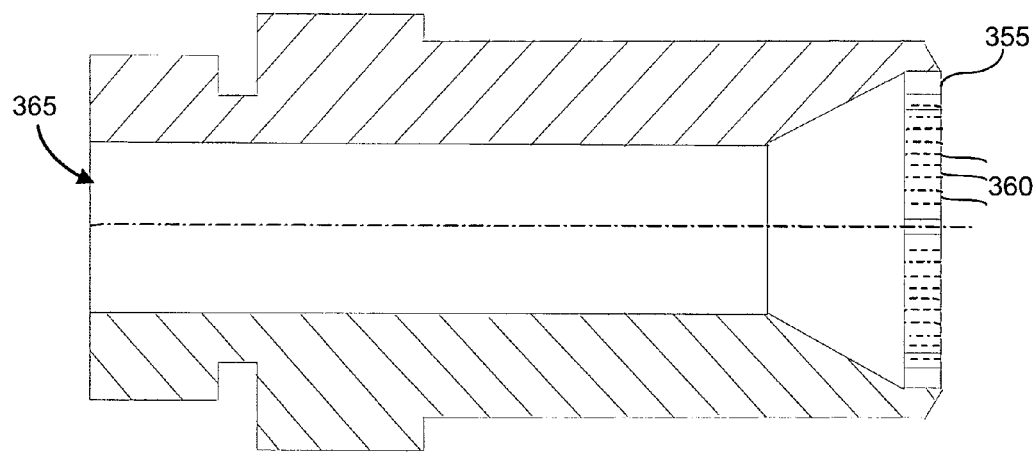
FIG. 3E is a diagram that shows a cross sectional view of the nozzle illustrated in FIG. 3D, according to an embodiment of the present invention.

FIGS. 3D and 3E illustrate shower-head nozzle 350 that may be used as the reference and measurement probes, according to an embodiment of the present invention. Shower-head nozzle 350 includes front surface 355, a plurality of gas bore front openings 360, and a gas bore rear opening 365. The multiple gas bore front openings distribute pressure across a wider area of measurement surface 132 than nozzle 310. A shower-head nozzle is principally used for lowering spatial resolution to evenly integrate proximity measurements over a wider spatial area. An alternative approach would be to use a nozzle that contains a porous filter.

A shower-head nozzle 350 is affixed to both measurement channel 116 and reference channel 118. In one embodiment, two identical shower-head nozzles 350 serve as measurement probe 128 and reference probe 130. In principle, the nozzles do not need to be identical. Shower-head nozzle 350 is affixed to measurement channel 116. Front surface 355 is parallel to measurement surface 132. Gas travelling through measurement channel 116 enters shower-head nozzle 350 through gas bore rear opening 365 and exits through a plurality of gas bore front openings 360. Similarly, shower-head nozzle 350 is affixed to reference channel 118. Front surface 355 is parallel to reference surface 134. Gas travelling through reference channel 122 enters shower-head nozzle 350 through gas bore rear opening 365 and exits through a plurality of gas bore front openings 360. The use of nozzles has been explained with reference to gas gauge proximity sensor 100 for ease of illustration. Each of the nozzle types may also be used with gas gauge proximity sensor 150, wherein the nozzles would be affixed to each of the measurement branch probes and the reference channel probe.

Exemplary embodiments of different types of nozzles have been presented. The present invention is not limited to these examples. The examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

B. Methods

Figure 4:
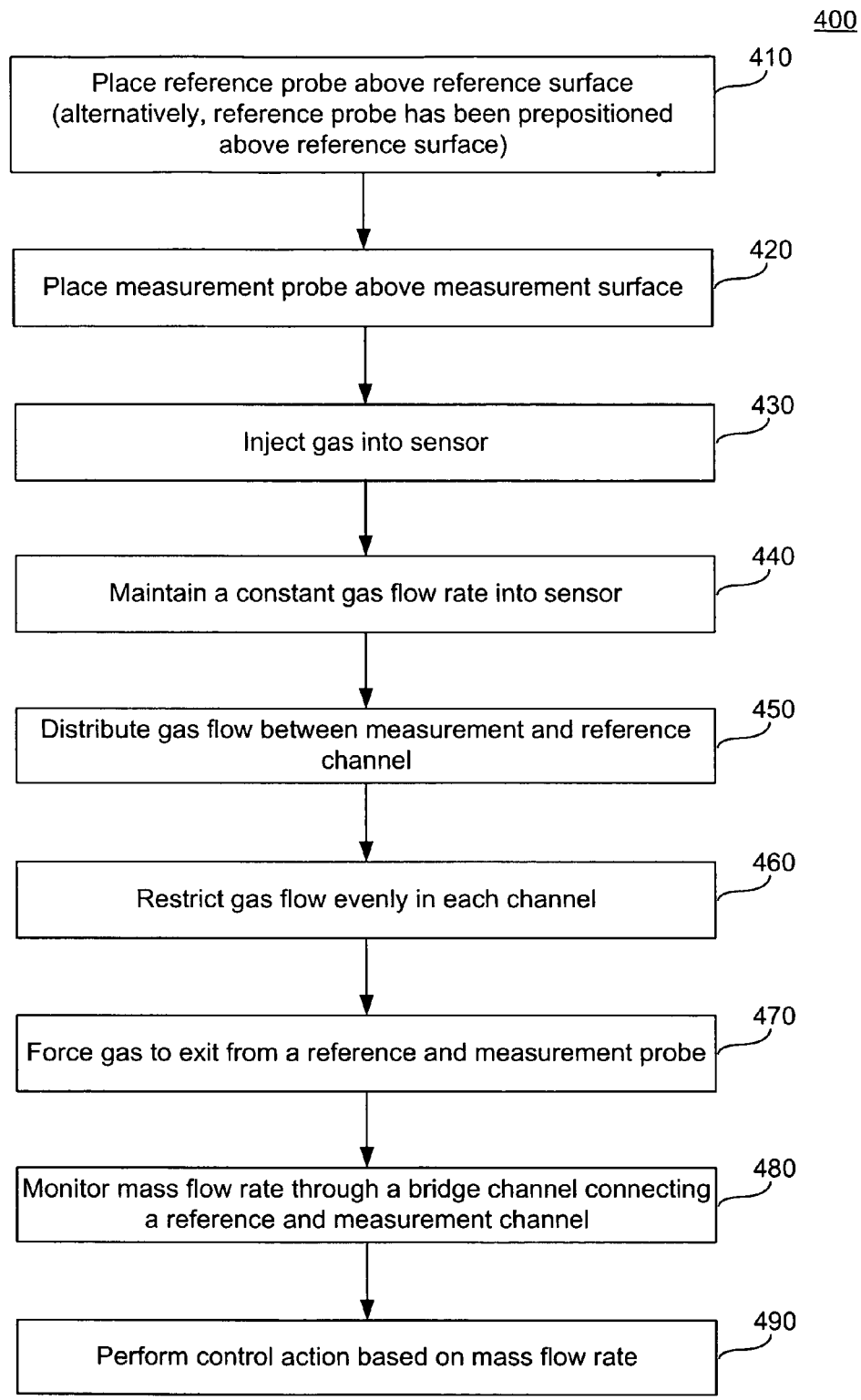
FIG. 4 is a flowchart diagram that shows a method for using a gas gauge proximity sensor to detect very small distances and perform a control action, according to an embodiment of the present invention.

The process illustrated in FIG. 4 presents a method 400 for using gas flow to detect very small distances and perform a control action (steps 410–470). For convenience, method 400 is described with respect to gas gauge proximity sensor 100. However, method 400 is not necessarily limited by the structure of sensor 100, and can be implemented with gas gauge proximity sensor 150 or a sensor with a different structure.

The process begins in step 410. In step 410, an operator or mechanical device places a reference probe above a reference surface. For example, an operator or mechanical device positions reference probe 130 above reference surface 134 with known reference standoff 142. Alternatively, the reference standoff can be arranged within the sensor assembly, that is, internal to the sensor assembly. The reference standoff is pre-adjusted to a particular value, which typically would be maintained constant. In step 420, an operator or mechanical device places a measurement probe above a measurement surface. For example, an operator or mechanical device positions measurement probe 128 above measurement surface 132 to form measurement gap 140.

In step 430, gas is injected into a sensor. For example, a measurement gas is injected into gas gauge proximity sensor 100 with a constant mass flow rate. In step 440, a constant gas flow rate into a sensor is maintained. For example, mass flow controller 106 maintains a constant gas flow rate. In step 450, gas flow is distributed between measurement and reference channels. For example, gas gauge proximity sensor 100 causes the flow of the measurement gas to be evenly distributed between measurement channel 116 and reference channel 118.

In step 460, gas flow in the measurement channel and the reference channel is restricted evenly across cross-sectional areas of the channels. Measurement channel restrictor 120 and reference channel restrictor 122 restrict the flow of gas to reduce pneumatic noise and serve as a resistive element in gas gauge proximity sensor 100.

In step 470, gas is forced to exit from a reference and measurement probe. For example, gas gauge proximity sensor 100 forces gas to exit measurement probe 128 and reference probe 130. In step 480, a flow of gas is monitored through a bridge channel connecting a reference channel and a measurement channel. In step 490, a control action is performed based on a pressure difference between the reference and measurement channel. For example, mass flow sensor 138 monitors mass flow rate between measurement channel 116 and reference channel 118. Based on the mass flow rate, mass flow sensor 138 initiates a control action. Such control action may include providing an indication of the sensed mass flow, sending a message indicating a sensed mass flow, or initiating a servo control action to reposition the location of the measurement surface relative to the reference surface until no mass flow or a fixed reference value of mass flow is sensed.

The above method may be adapted to use with a sensor that has multiple measurement branches, such as gas gauge proximity sensor 150. When gas gauge proximity sensor 150 is used, an additional step may be incorporated that includes switching from the use of one measurement branch to another measurement branch.

The use of a gas gauge proximity sensor 150 can also better facilitate the mapping of the topography of a mesurement surface. This mapping may be accomplished through the principles described in the above method, wherein topography measurements are taken over a particular region of a work surface using one of the measurement branches. If a topography mapping is desired of a different region, the flow of gas may be switched to a different measurement branch to map the topography of a different region. Because of limitations that may exist in the ability to move a measurement surface, a proximity sensor with multiple branches can be used in some instances to more readily map the topography of a measurement surface than a proximity sensor with only one measurement channel.

For example, in one embodiment a method for mapping the topography includes injecting gas into a proximity sensor, such as gas gauge proximity sensor 150, and measuring the topography of a region of a measurement surface by taking a series of measurements using one of the measurement branches. Upon completing the mapping of the region that can be mapped by a particular measurement branch, the proximity sensor would be switched to a different measurement branch to repeat the mapping process for the region reached by that measurement branch. The process would be repeated until the surface for which a topography mapping is desired is completed. The measurement surface may be a semiconductor wafer or other measurement surface for which a topography mapping is desired.

Additional steps or enhancements to the above steps known to person skilled in the relevant art(s) form the teachings herein are also encompassed by the present invention.

The present invention has been described with respect to FIGS. 1–4 with reference to a gas. In one embodiment the gas is air. The present invention is not limited to air. Other gases or combinations of gases can be used. For example, depending on the surface being measured, a gas having a reduced moisture content or an inert gas may be used. A low moisture content gas or inert gas is less likely than air to react with the surface being measured.

C. Model and Simulation Results

Figure 6:
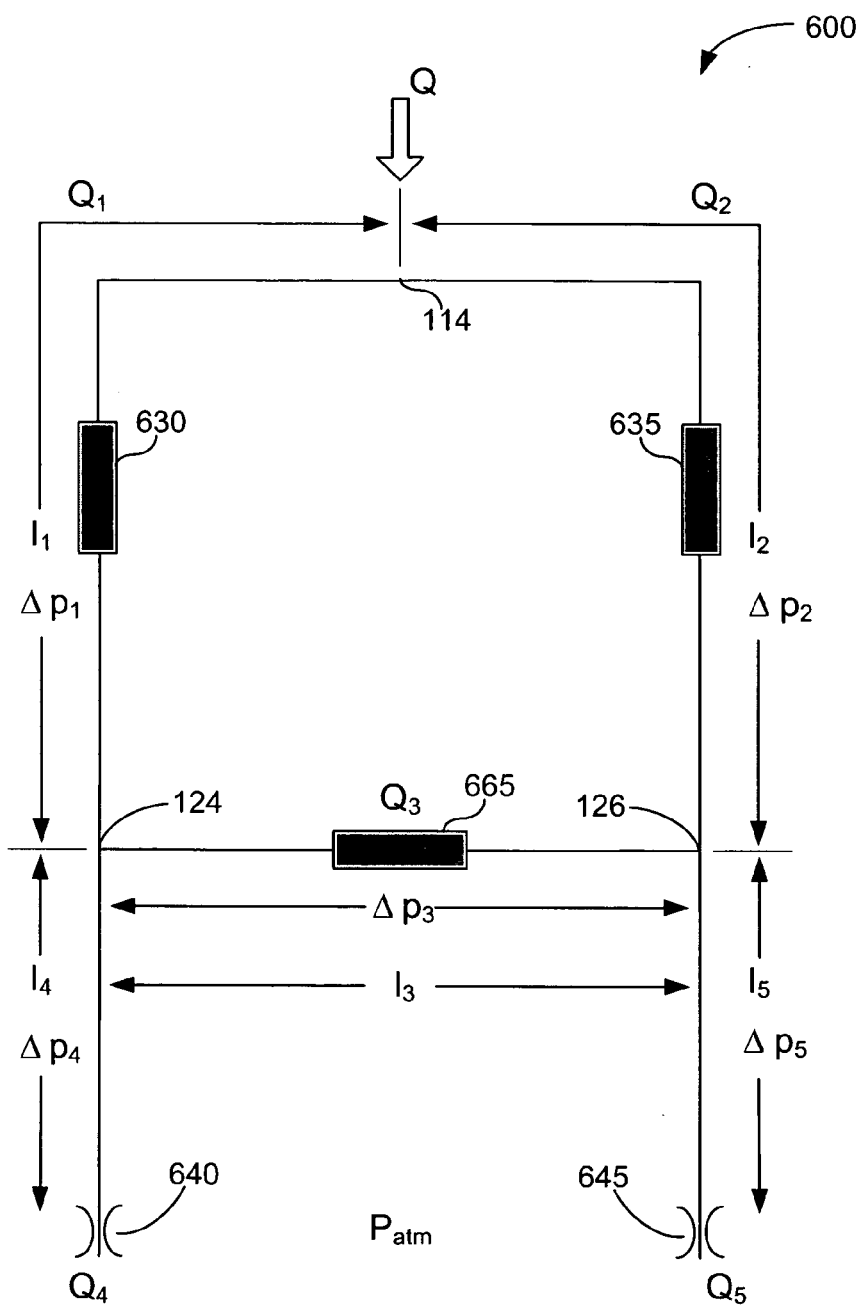
FIG. 6 is a schematic diagram of a gas gauge proximity sensor in a bridge configuration according to an embodiment of the present invention whose operation is simulated by a one-dimensional model.

The inventors developed a one-dimensional (1-D) model to simulate operation of a gas gauge proximity sensor ("gas gauge") in a bridge configuration according to an embodiment of the present invention for which a prototype was built. FIG. 6 is a schematic diagram of a gas gauge proximity sensor 600 (also referred to as a "bridge" 600) whose operation is described with respect to the one-dimensional model. As shown in FIG. 6, gas gauge 600 includes five legs 11–15, two porous flow restrictors 630, 635, measurement nozzle 640, reference nozzle 645, and a mass flow sensor 665. Leg 11 extends from junction 114 to junction 124. Leg 12 extends from junction 114 to junction 126. Leg 13 extends between junctions 124 and 126. Leg 14 extends from junction 124 to measurement nozzle 640. Leg 15 extends from junction 126 to reference nozzle 645. Porous flow restrictor 630 is provided along leg 11. Porous flow restrictor 635 is provided along leg 12. Measurement nozzle 640 is provided at the end of leg 14. Reference nozzle 645 is provided at the end of leg 15. Mass flow sensor 665 is provided along leg 13.

The 1-D model of the gas gauge aids the development process of the gas gauge. The model allows for a selection of the gas gauge physical parameters and yields a quick assessment of the gas gauge performance under steady state operation.

It is assumed that all the gas passages of bridge 600 have circular cross-section with the same diameter. The most significant contribution to pressure drop in the legs of the bridge is from flow restrictors 630, 635 and nozzles 640, 645, however a distributed contribution from viscous loses in the tubes of legs 11–15 is considered. Local losses at elbows and junctions 114, 124, 126 are neglected, as they are relatively small.

With these assumptions, steady incompressible flow of gas through bridge 600, as shown in FIG. 6, is governed by the following set of algebraic equations:

$$Q = Q_1 + Q_2, \quad (4)$$

$$Q_4 = Q_1 + Q_3, \quad (5)$$

$$Q_5 = Q_2 - Q_3, \quad (6)$$

$$\Delta p_1 = \Delta p_2 + \Delta p_3, \quad (7)$$

$$\Delta p_5 = \Delta p_4 + \Delta p_3, \quad (8)$$

$$\Delta p_i = f_i(Q_i), \ i=1,\ldots,5 \quad (9)$$

Balancing the flow rates $Q_i$ in the junctions of the bridge results in equations (4–6), while balancing the values of pressure drop $\Delta p_i$ across the legs in the loops of the bridge yields equations (7) and (8). Equation (9) defines relationships between the flow rate Q and the pressure drop $\Delta p$ across each of the legs (i=1 . . . 5).

The pressure drop for the upper legs, 11 and 12, is a sum of viscous loses in the tubes and (also viscous) loses in the porous restrictors:

$$\Delta p_i = \lambda_i \frac{l_i}{d_i} \rho \frac{w_i^2}{2} + \frac{\mu}{K} l_{Ri} w_i \quad i = 1, 2, \quad (10)$$

where $l_i$ and $d_i$ are the tube length and diameter, while $w_i$ is the (cross-section averaged) velocity in the leg i. For laminar pipe flow the pressure loss coefficient is a function of the Reynolds number alone:

$$\lambda = \frac{64}{\text{Re}}. \quad (11)$$

The pressure loss in a porous restrictor is modeled after Darcy's law. See, A. Bejan, *Convective Heat Transfer*, Chapter 10 John Wiley & Sons, 1984. The restrictors 630, 635 are of the length $l_R$ and have the same diameter as the tube in legs 11 and 12 that results in the same averaged velocity $w_i$. The constants $\mu$ and K are the dynamic viscosity of fluid (air) and the permeability of the porous material, correspondingly. The pressure drop can be expressed in terms of the mass flow rate $Q_i$. Substituting for the velocity $w_i$, $$w_i = \frac{4 Q_i}{\pi d_i^2} \quad (12)$$

yields $$\Delta p_i = \left( A \frac{l_i}{d_i^4} + C \frac{l_{Ri}}{d_i^2} \right) Q_i \quad i = 1, 2, \quad (13)$$

with the constants A and C:

$$A = \frac{128 \nu}{\pi}, \quad C = \frac{4 \Theta}{\pi \rho}. \quad (14)$$

$\nu$ and $\rho$ are the kinematic viscosity and density of the gas (air), correspondingly, and $\Theta$ is the conductivity of porous material.

The pressure drop in the bridging leg 13 is modeled simply as:

$$\Delta p_3 = \alpha Q_3, \quad (15)$$

because the actual behavior of the mass flow sensor is linear at sufficient level of approximation. The coefficient $\alpha$ was determined experimentally showing good agreement with technical specifications of the mass flow meter.

The pressure drop for legs 14 and 15 is modeled as a sum of viscous loses in the tube (similarly as for legs 11 and 12) and the losses in the nozzles:

$$\Delta p_i = \lambda_i \frac{l_i}{d_i} \rho \frac{w_i^2}{2} + \frac{\rho u_i^2}{2} 78.493 \left( \frac{h_i}{D} \right)^{-1.3114} \bigg/ \frac{u_i D}{\nu} \quad i = 4, 5, \quad (16)$$

The second component of the sum in equation (16) represents a semi-empirical, similarity-based model for the pressure drop across a nozzle. Variable $u_i$ denotes the area-averaged value of the radial velocity at the entrance to the annular region between the surface of a wafer and the face of the of the air gauge nozzle. This velocity can be calculated as $$u_i = \frac{Q_i}{\pi D h_i} \quad i = 4, 5, \quad (17)$$

where D is the inner diameter (ID) of the nozzle (both nozzles 640, 645 are identical) and $h_i$ is the gauge standoff. Making appropriate substitutions yields:

$$\Delta p_i = \left( A \frac{l_i}{d_i^4} + \frac{78.493 \nu}{2 \pi} h^{-2.3114} D^{-0.6886} \right) Q_i \quad i = 4, 5. \quad (18)$$

The system of ten equations (4–8, 13, 15, 18) is linear with respect to the flow rates $Q_i$. Validity of the laminar flow assumption was confirmed by calculating Reynold's Numbers for the respective sections of the entire system. A Matlab program can be used to numerically solve the above equations for a given set of input parameters.

1. Selection of Simulation Parameters

Main parameters for the simulation were selected to match a working prototype of gauges 100, 600 with air as the gas. The main parameters are summarized below.

Properties of air:

| | | |
|---|---|---|
| density | $\rho$ = 1.2003 | [kg/m$^3$] |
| dynamic viscosity | $\mu$ = 1.8189 E–05 | [kg/(ms)] |
| kinematic viscosity | $\nu$ = 1.5157 E–05 | [m$^2$/s] |

Properties of porous material:

| | | |
|---|---|---|
| porous conductivity | $\Theta$ = 4327 E02 | [kg/(sm$^3$)] |

Flowmeter response (linear):

| | | |
|---|---|---|
| calibration constant | a = 1144 E04 | [1/(ms)] |

Air gauge geometric parameters:

| | | Leg # | | | | |
|---|---|---|---|---|---|---|
| | | 1 | 2 | 3 | 4 | 5 |
| Diameter | [mm] | 3.37 | 3.37 | — | 3.37 | 3.37 |
| Length | [mm] | 38.1 | 101.6 | — | 70.9 | 32.4 |
| Porous insert length | [mm] | 7.0 | 7.0 | — | — | — |

2. Results

Figure 7:
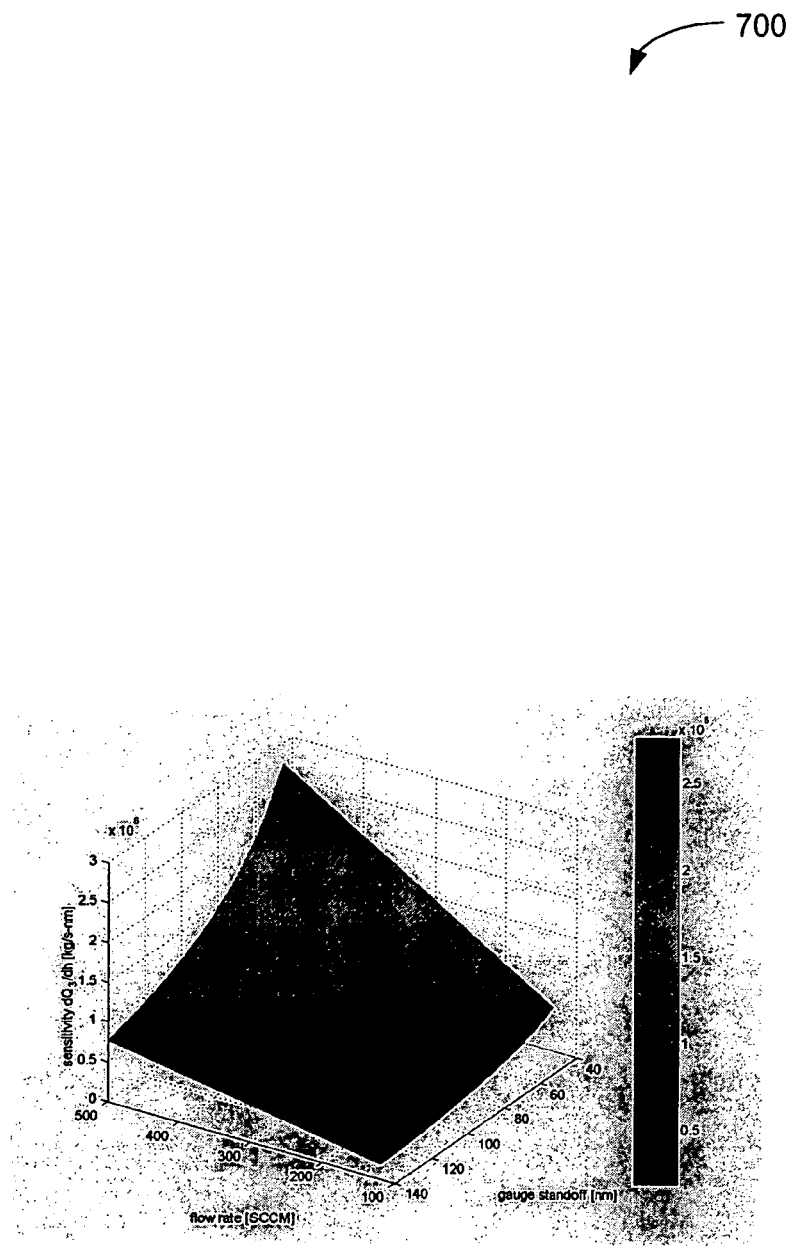
FIG. 7 is a sensitivity plot that illustrates simulation results as a function of air mass flow rate and gauge nozzle standoff.
Figure 8:
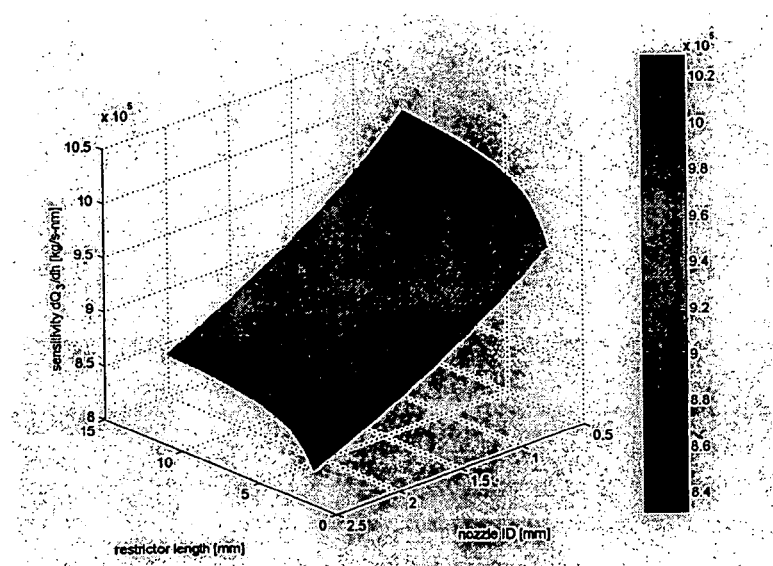
FIG. 8 is a sensitivity plot that illustrates simulation results as a function of nozzle inner diameter (ID) and length of the porous restrictors.

Results of the simulation are shown in terms of sensitivity plots as a function of the mass flow rate and the gauge nozzle standoff (FIG. 7) and as a function of the nozzle ID and the length of the porous restrictors (FIG. 8).

Specifically, FIG. 7 illustrates a sensitivity plot as a function of the mass flow rate and gauge nozzle standoff for a gauge with a nozzle having a 1.14 mm internal diameter (ID) and a restrictor that is 7 mm in length. To generate the plot, gauge standoffs ranging from 40 to 140 mm were used and flow rates ranging from 100 to 500 sccm. The plot shows that as the gauge standoff becomes smaller, the sensitivity of the gauge to detect changes in the difference between a reference standoff and a measurement standoff increases. The plot shows that the rate of sensitivity increase as the gauge standoff becomes smaller is more pronounced at higher flow rates. Similarly, for a constant gauge standoff, as the flow rate of gas through the gauge increases, the sensitivity also increases.

FIG. 8 illustrates a sensitivity plot as a function of the nozzle ID and restrictor length when the measurement standoff is 100 mm and the flow rate is 200 sccm. To generate the plot, nozzles with IDs ranging from 0.5 to 2.5 mm were used and restrictors with lengths ranging from 5 to 15 mm were used. The plot shows that as the nozzle ID becomes smaller, the sensitivity of the gauge to detect changes in the difference between a reference standoff and a measurement standoff increases. The plot further shows that the rate of sensitivity increase as the nozzle ID becomes smaller, remains relatively consistent over the different restrictor lengths. Finally, the plot illustrates a relatively small dependence of the gauge sensitivity on the length of both restrictors.

As can be seen from FIG. 7 and FIG. 8, the sensitivity dependence on the flow rate and the standoff is relatively major. It increases (linearly) with the flow rate and decreases with the standoff at a faster than linear rate. The sensitivity dependence on the two other parameters (nozzle ID and the restrictor length) is considerably weaker within practical limits of the variability of these parameters. It decreases with the ID of the nozzle and increases with the restrictor length. The data show that the increasing the flow rate can be used to improve the gauge sensitivity as long as this would not cause an increase in the aerodynamic noise. Transition to turbulence would certainly be a practical limitation on the maximum flow rate that can be used.

D. Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of method steps illustrating the performance of specified functions and relationships thereof. The boundaries of these method steps have been arbitrarily defined herein for the convenience of the description. Alternate boundaries can be defined so long as the specified functions and relationships thereof are appropriately performed. Any such alternate boundaries are thus within the scope and spirit of the claimed invention. Thus, the breadth and scope of the present invention should not be limited by any of the above-described exemplary embodiments, but should be defined only in accordance with the following claims and their equivalents.

What is claimed is:

1. A gas gauge lithography proximity sensor for sensing a difference between a reference surface standoff and a measurement surface standoff, comprising:
    a junction that divides gas input into the gas gauge proximity sensor into a reference channel and a measurement channel;
    a first porous flow restrictor placed along the reference channel, wherein said first porous flow restrictor evenly restricts gas flow through the reference channel;
    a second porous flow restrictor placed along the measurement channel, wherein said second porous flow restrictor evenly restricts gas flow through the measurement channel;
    a reference probe at an end of the reference channel, wherein gas exits the reference channel through the reference probe and travels across a reference standoff to impinge upon a lithographic reference surface;
    a measurement probe at an end of the measurement channel, wherein gas exits the measurement channel through the measurement probe and travels across a measurement standoff to impinge upon a lithographic measurement surface; and
    a mass flow sensor coupled between the reference and measurement channels for sensing the mass of gas flow therebetween.

2. The sensor of claim 1, further comprising a mass flow controller located before said junction to output a constant mass flow rate of gas.

3. The sensor of claim 2, further comprising a snubber located after said mass flow controller to reduce gas turbulence.

4. The sensor of claim 1, further comprising a snubber located prior to said junction.

5. The sensor of claim 1, wherein said first and second porous flow restrictors are made of respective first and second porous materials, said first and second porous materials having substantially the same permeability characteristics.

6. The sensor of claim 5, wherein said first porous material and said second porous material are identical and include polyethylene.

7. The sensor of claim 5, wherein said first porous material and said second porous material are identical and include sintered stainless steel.

8. The sensor of claim 1, wherein said first and second porous flow restrictors each have a length between approximately 2 and 15 mm.

9. The sensor of claim 1, wherein said reference probe and said measurement probe each comprise one or more gas bores.

10. The sensor of claim 9, wherein said reference probe and said measurement probe and each gas bore extend along a direction perpendicular to the reference surface and the measurement surface.

11. The sensor of claim 1, wherein said reference probe and said measurement probe each comprise a single gas bore having an inner diameter between approximately 0.5 and 2.5 mm.

12. The sensor of claim 1, wherein said reference probe and said measurement probe each comprise a nozzle.

13. The sensor of claim 1, wherein said reference probe and said measurement probe each comprise a shower head nozzle.

14. The sensor of claim 1, wherein the mass of gas flow sensed by said mass flow sensor is indicative of a difference between the measurement standoff and the reference standoff in a nanometer range.

15. In lithography, a method for sensing a difference in a reference standoff and a measurement standoff, comprising the steps of:
   (a) distributing a flow of gas between a measurement channel and a reference channel;
   (b) forcing the flow of gas through porous restrictors substantially evenly across cross-sectional areas of both the measurement and reference channels;
   (c) outputting gas from the reference and measurement channels through nozzles to impinge upon a lithographic reference surface and a lithographic measurement surface, respectively; and
   (d) sensing a mass flow rate across a bridge channel that connects the reference and measurement channels, the mass flow rate being representative of the magnitude of a difference between a measurement standoff and a reference standoff.

16. The method of claim 15, wherein step (d) comprises the step of monitoring the mass flow rate across a bridge channel that connects the reference and measurement channels, the mass flow rate being representative of the magnitude of the difference between the measurement standoff and the reference standoff.

17. The method of claim 15, wherein step (d) comprises the step of monitoring gas pressure differences in the reference and measurement channels, the gas pressure differences being representative of the magnitude of the difference between the measurement standoff and the reference standoff.

18. The method as in claim 15, further comprising performing a control action in response to said sensing step.

19. A gas gauge proximity sensor for sensing a difference between a reference surface standoff and a measurement surface standoff, comprising:
   a junction that divides gas input into the gas gauge proximity sensor into a reference channel and a measurement channel;
   a first porous flow restrictor placed along the reference channel, wherein said first porous flow restrictor evenly restricts gas flow through the reference channel;
   a second porous flow restrictor placed along the measurement channel, wherein said second porous flow restrictor evenly restricts gas flow through the measurement channel;
   a reference probe at an end of the reference channel, wherein gas exits the reference channel through the reference probe and travels across a reference standoff to impinge upon a lithographic reference surface;
   a measurement probe at an end of the measurement channel, wherein gas exits the measurement channel through the measurement probe and travels across a measurement standoff to impinge upon a lithographic measurement surface; and
   a mass flow sensor coupled between the reference and measurement channels for sensing the mass of gas flow therebetween, wherein the first porous flow restrictor and the second porous flow restrictor are located between said junction and points on the reference channel and measurement channel wherein said mass flow sensor is coupled.

* * * * *